United States Patent [19]

Childers et al.

[11] Patent Number: 4,547,868
[45] Date of Patent: Oct. 15, 1985

[54] DUMMY-CELL CIRCUITRY FOR DYNAMIC READ/WRITE MEMORY

[75] Inventors: Jimmie D. Childers, Missouri City; Adin E. Hyslop, Houston, both of Tex.

[73] Assignee: Texas Instruments Incorporated, Dallas, Tex.

[21] Appl. No.: 634,900

[22] Filed: Jul. 26, 1984

[51] Int. Cl.[4] .............................................. G11C 7/00
[52] U.S. Cl. ...................................... 365/203; 365/210
[58] Field of Search ......................... 365/149, 203, 210

[56] References Cited

U.S. PATENT DOCUMENTS 4,262,342  4/1981  Tuan .................................... 365/203
4,503,343  3/1985  Ohuchi ............................... 365/203

FOREIGN PATENT DOCUMENTS 0094987  6/1982  Japan .................................. 365/203

Primary Examiner—James W. Moffitt
Attorney, Agent, or Firm—John G. Graham

[57] ABSTRACT

A semiconductor dynamic read/write memory circuit using one-transistor storage cells and balanced bit lines with differential sense amplifiers employs dummy capacitors which are the same size as the storage capacitors. The dummy cell produces a signal on the bit line half that of the storage cell due to a level-shift circuitry connected to the dummy cells. The dummy capacitor is precharged to a reference voltage, and at the beginning of an active cycle the dummy capacitor is charge-shared with another capacitance of the same size, to change the reference level. The net signal is thus equal to that of a capacitor one-half the size of the storage capacitors.

11 Claims, 5 Drawing Figures

DUMMY-CELL CIRCUITRY FOR DYNAMIC READ/WRITE MEMORY

BACKGROUND OF THE INVENTION

This invention relates to semiconductor memory devices, and more particularly to improved dummy cell circuitry in dynamic memory devices.

Dynamic MOS read/write memory devices have been constructed generally as shown in U.S. Pat. No. 3,940,747 (a 4K dynamic RAM) issued to Kuo, U.S. Pat. No. 4,081,701 (a 16K dynamic RAM) issued to White, McAdams and Redwine, or U.S. Pat. No. 4,239,993 (a 64K dynamic RAM) issued to McAlexander, White and Rao, all assigned to Texas Instruments.

In these and other prior devices a row of dummy cells on each side of each differential sense amplifier was used as a reference input. The capacitors in the dummy cells were about one-half the size of the storage capacitors, and typically the dummy capacitors were predischarged to ground. So, the signal produced in the bit lines by the dummy cells was about half way between that produced by a one and that produced by a zero in the storage cell.

When the cell size is reduced to the level needed to manufacture high density memory devices of 256K-bit or 1-Megabit and beyond, the problem of forming the dummy capacitors at the proper ratio to the storage capacitors becomes formidable, from a process standpoint. A slight variation in the process conditions results in a much greater change in value of the smaller capacitor than the larger.

It is the principal object of this invention to provide improved circuitry for high density dynamic RAM devices, particularly dummy cell circuitry. Another object is to provide dummy cell circuitry for a dynamic RAM in which the dummy cell capacitors are the same size as the storage capacitors. A further object is to provide dummy cell circuitry which can be manufactured without adverse effects of process variations upon the dummy cell size.

SUMMARY OF THE INVENTION

In accordance with one embodiment of the invention, a semiconductor dynamic read/write memory circuit using one-transistor storage cells and balanced bit lines with differential sense amplifiers employs dummy capacitors which are the same size as the storage capacitors. The dummy cell produces a signal on the bit line half that of the storage cell due to level-shift circuitry connected to the dummy cells. The dummy capacitor is precharged to a reference voltage, and at the beginning of an active cycle the dummy capacitor is charge-shared with another capacitance of the same size, to change the reference level. The net signal is thus equal to that of a capacitor one-half the size of the storage capacitor.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1A:
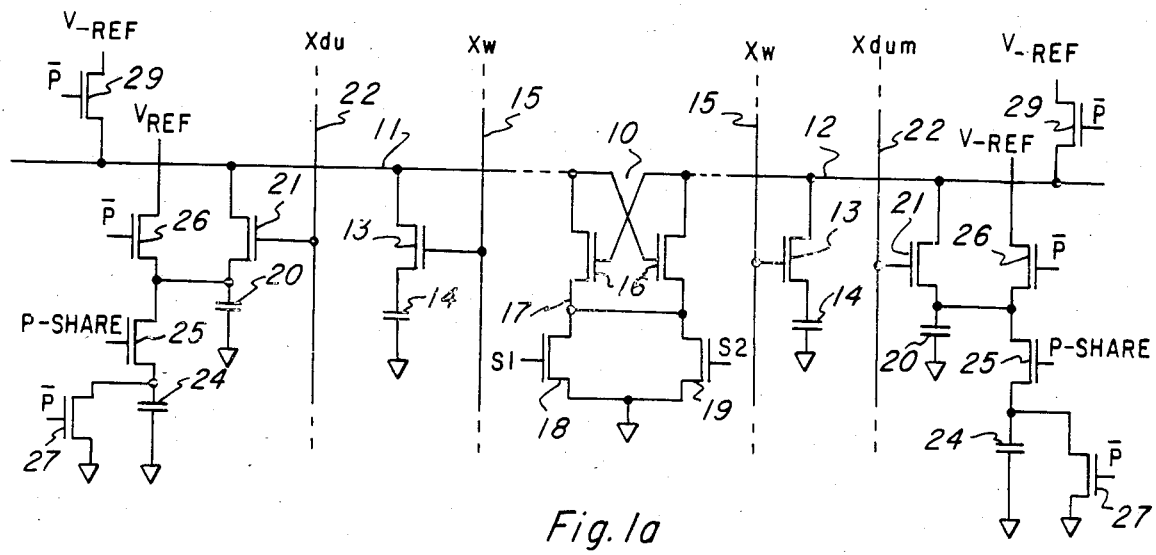
FIG. 1a is an electrical schematic diagram of a sense amplifier for a dynamic RAM constructed according to the invention.
Figure 1B:
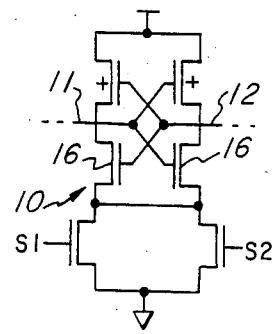
FIG. 1 is an electrical schematic diagram of dummy cell circuitry for a dynamic RAM constructed according to the invention.

Referring to FIGS. 1 and 1a, a part of a dynamic read/write memory cell array is shown according to the invention. The circuit of FIG. 1 is only a very small part of what may be 256K or 1-Meg memory cells in an array of rows and columns. Each column has a sense amplifier 10 connected to bit lines 11 and 12, (two bit lines per column). Each bit line has a number of one-transistor memory cells connected to it, each cell having an access transistor 13 and a storage capacitor 14. The gates of the access transistors are connected to word lines 15 running perpendicular to the bit lines. Depending upon the size of the array and the way it is partitioned, there may be, for example, thirty-two or sixty-four word lines 15 on each side of each sense amplifier 10, with a cell for each word line at each bit line.

Although various sense amplifier circuits may be used, the one shown consists of cross-coupled driver transistors 16 connected to a grounding node 17, and grounding transistors 18 and 19 connecting this node to ground. The sense amplifier is activated by sense clocks S1 and S2 on the gates of these transistors 18 and 19. The transistor 18 is much smaller, i.e. of higher resistance, and this device is turned on first by S1 for initial sensing. Then the larger transistor 19 is turned on by S2 after a delay. This type of sense amplifier circuitry is shown in U.S. Pat. Nos. 4,081,701 and 4,239,993 mentioned above.

According to the invention, dummy cells are provided on each side of the sense amplifier 10 wherein the dummy capacitors 20 are of the same physical size as the storage capacitors 14. Access transistors 21 in series with the dummy cells are activated by dummy row lines 22. In an active cycle, when the address input to the memory device selects a new line 15 on the right side of the sense amplifier 10, then the dummy row 22 on the left side is activated, and vice versa. The purpose of the dummy cell is to provide a signal on the side of the sense amplifier opposite that of the selected storage cell; this signal should be of magnitude half way between that produced on a bit line by a one in the storage capacitor 14 and that produced by a zero. Since the capacitor 20 is the same size as the storage capacitor 14, instead of one-half as big as was true in prior DRAMs, additional circuitry is provided to reduce the signal produced on the bit lines by the dummy capacitors. In particular, another dummy capacitor 24 is provided, along with a coupling transistor 25 activated by the clock P. This functions as a charge-sharing circuit. In the precharge period, $\overline{P}$ is high and this charges the capacitor 20 to a voltage V-ref through a transistor 26, and discharges the capacitor 24 to ground through a transistor 27 on each side of the sense amplifier. Thereafter, when the clock P turns on the transistor 25, the capacitors 20 and 24 will charge-share, so the net charge on dummy capacitor 20 is about half its initial value of V-ref, assuming the magnitude of capacitor 24 is the same as that of a storage capacitor 14. Thus, when one of the lines 22 goes high, and the dummy capacitor 20 for this side is coupled to the bit line 11 or 12, the proper charge level is coupled.

The bit lines 11 and 12 are precharged to the voltage V-REF through transistors 29 which have the precharge clock $\overline{P}$ on their gates. For example V-REF may be one half the supply voltage Vdd, or may be both Vdd-2Vt, as examples. The precharge clock $\overline{P}$ must be at least one threshold voltage Vt above the reference voltage V-REF.

Although not shown in the diagram, active pull-up circuits may be connected to the bit lines 11 and 12 to restore the one-going side to a full Vdd voltage level. These circuits are shown in the above-mentioned U.S. Pat. Nos. 4,081,701 and 4,239,993. Or a CMOS sense amp, FIG. 1a.

Figure 2:
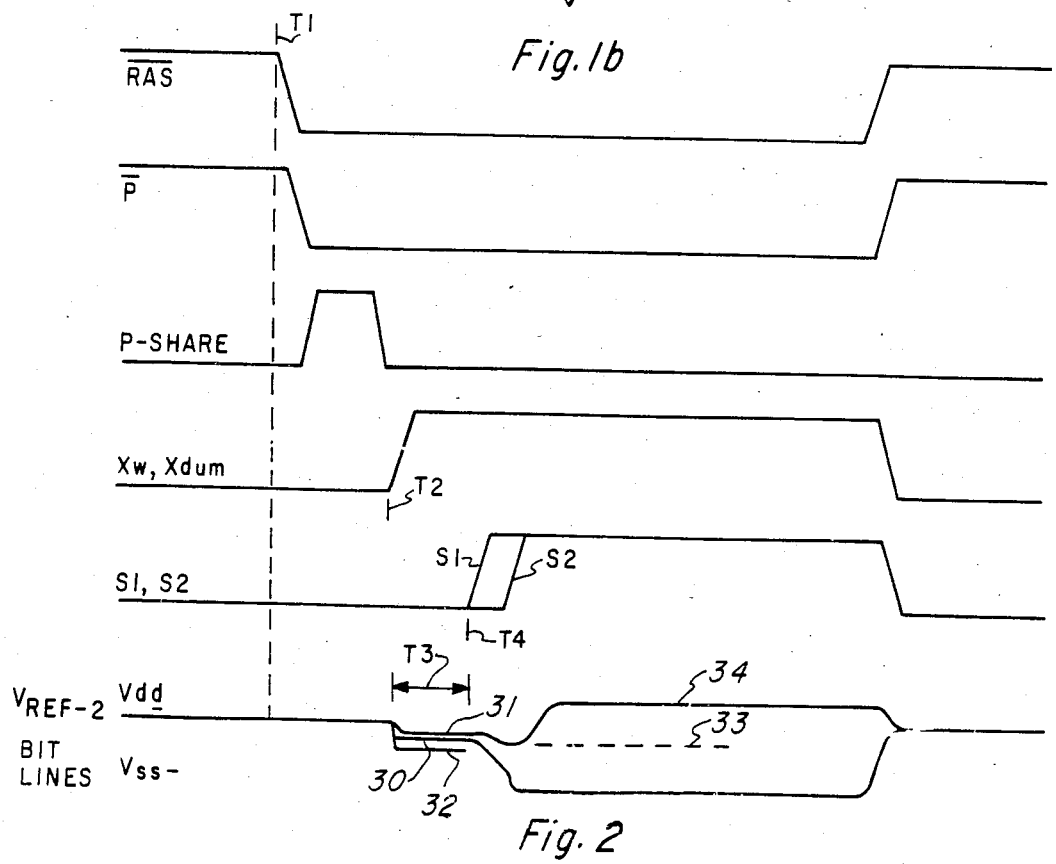
FIG. 2 is a timing diagram showing a plot of voltage vs. time for nodes in the circuit of FIG. 1.

The operation of the circuit of FIG. 1 is best understood by reference to the timing diagram of FIG. 2. An active cycle is initiated by a row address strobe voltage $\overline{RAS}$ dropping from Vdd to zero, shown at time T1. Prior to T1 is a precharge period where clock $\overline{P}$ is high, and this clock drops to zero at T1 when $\overline{RAS}$ falls. The V-REF voltage is left on the bit lines 11 and 12, V-REF is trapped on the dummy capacitors 20, and the dummy capacitors 24 are fully discharged, when $\overline{P}$ goes low at T1. The clock D goes high for all dummy cells for a short period between T1 and T2, triggered by $\overline{RAS}$ falling, and this functions to charge-share between capacitors 20 and 24. The word select voltage Xw goes high on on line 15 at T2 after the row address has been decoded, and the dummy select voltage Xdum on one line 22 goes high at the same time as Xw. The bit line 11 or 12 on the dummy side will go to a voltage determined by the result of the charge-share.

After Xw and Xdum go high at T2, the bit lines 11 and 12 separate during the time T3 of FIG. 2. The bit line on the dummy side goes to a fixed level 30 which should be midway between a voltage 31 produced on the other bit line for a minimum one-level stored in the capacitor 14, and a voltage 32 produced for a maximum zero-level in the capacitor 14. Ideally, a stored one is at or near Vdd, but it may decay with time to a level such as 2.5, more or less, depending upon the specifications for the device. Likewise, a stored zero should be ground or Vss in a capacitor 14, but a voltage level up to perhaps +0.5 should be read as a zero.

At time T4 in FIG. 2 the sense clock S1 goes high, activating the sense amplifier 10. This causes the bit lines 11 and 12 to separate more as one of the cross-coupled transistors turns on faster than the other. Then after a delay S2 goes high to turn on the larger transistor 14 and force the bit lines more rapidly to a one-zero set. The one-going side would stay at the partially-discharged level 33, but an active-pull up circuit may restore it to the Vdd level 34, or FIG. 1a circuit.

The column addressing and column input/output circuitry for the cell array would be of conventional construction as set forth in the above-mentioned patents.

The purpose of the dummy cell 20 of FIG. 1 is to supply (or drain) charge to the bit line 11 or 12 of an amount greater than the charge supplied by a stored zero in cell 14, and to supply less charge than that supplied by a stored one; this objective can be accomplished by various charge-sharing means as discussed herein, so long as the charge supplied (or removed) to the bit line remains consstant. This charge supplied (or removed), defined to be Qs, may be shown to equal $$\left[\frac{Cb \times C20}{Cb + C20}\right] (Vdo - Vbo)$$

where Cb is the capacitance of a bit line; C20 is the value of the dummy capacitor 20; Vdo is the voltage on dummy capacitor 20 prior to charge sharing; Vbo is the voltage on the bit line prior to charge sharing. With Cb and Vbo constant, and Qs constant, a fixed relationship between the size of dummy capacitor 20 and the initial voltage Vdo on the dummy capacitor is seen:

$$Vdo = \frac{(Cb + C20)Qs + (Cb \times C20 \times Vbo)}{Cb \times C20} = \left(\frac{1}{C20} + \frac{1}{Cb}\right) Qs + Vbo$$

By choosing C20≧C14, it is possible to calculate an appropriate Vdo for the dummy capacitor, while making the capacitor 20 large enough to be constructed without process problems. The selection of the value of C24, the magnitude of the capacitor 24, may be approximated by the equation $$C24 = \left[\frac{C20 \times Vref}{\left(\frac{1}{C20} + \frac{1}{Cb}\right) Qs + Vbo}\right] - C20$$

The value of the reference voltage Vref may then be selected to make C24 of acceptable size; for example, C24=C14.

Figure 3:
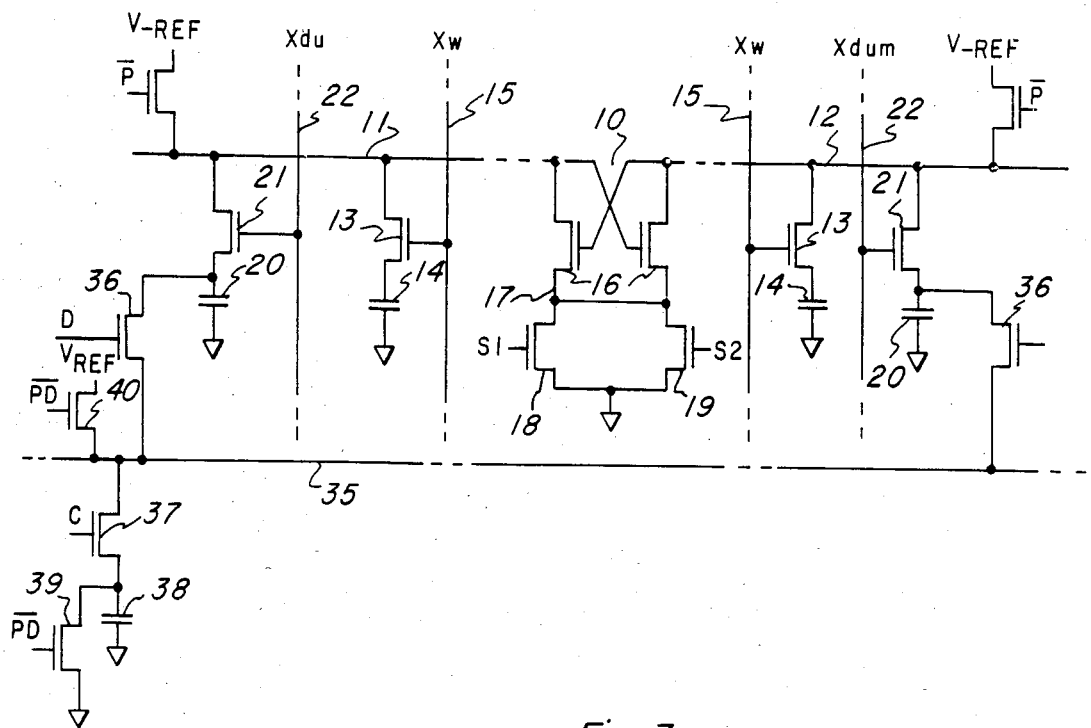
FIG. 3 is an electrical schematic diagram of another embodiment of the invention.
Figure 4:
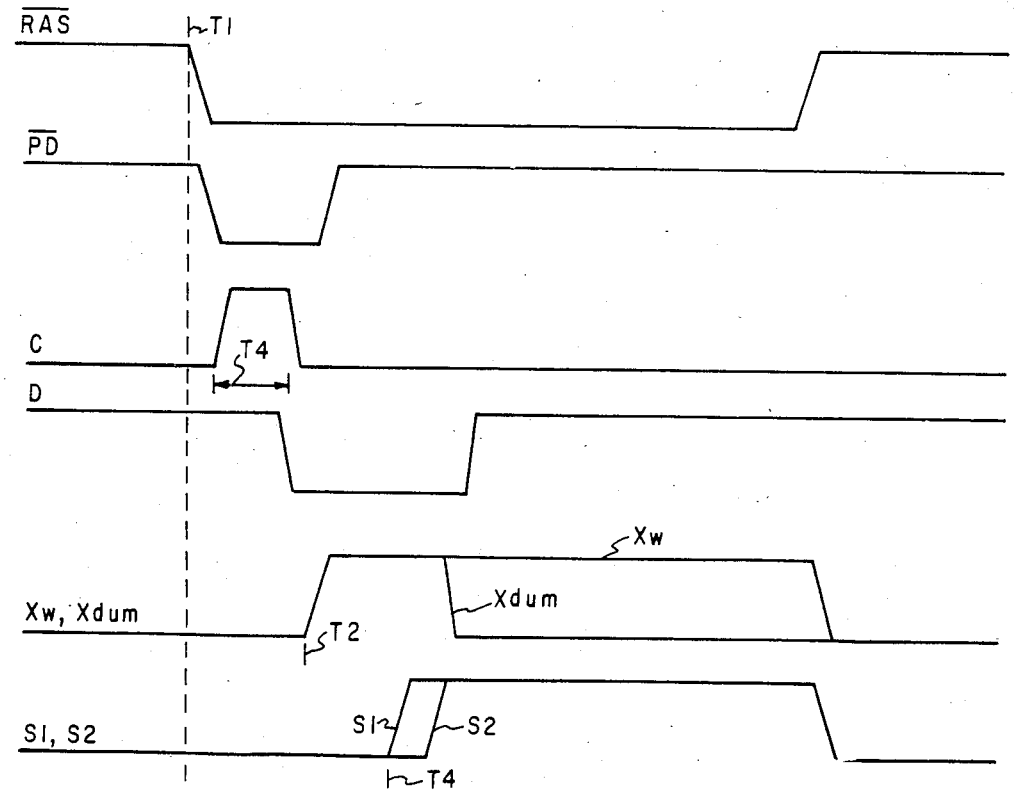
FIG. 4 is a timing diagram for the embodiment of FIG. 3.

In another embodiment, the capacitor 24 and its associated predischarge transistor 27 may be in common with all of the dummy cells in the two dummy rows of the array. Referring to FIG. 3, a common line 35 connects to the drain of all of the charge-share transistors 36, and this common line is connected through another charge-share transistor 37 to a capacitor 38. The size of the capacitor 38 of FIG. 3 is N times the capacitance of the transistor 24 of FIG. 1, where N is the number of dummy cells on the common line. The large capacitor 38 is predischarged to ground through a transistor 39 having a dummy precharge voltage $\overline{PD}$ on its gate. However, the dummy capacitor 14 is precharged to V-ref through a single shared transistor 40 on the common line 35, so both transistor 40 and transistor 36 must be turned on to precharge the dummy capacitors 20. As seen in FIG. 4, prior to T1 the precharge voltage $\overline{PD}$ holds the transistor 39 on, discharging the capacitor 38; at this time the transistor 40 charges the common line 35 to V-ref, and the transistors 36 are all turned on by the voltage D to precharge all of the dummy capacitors 20 to V-ref. At time T1 when $\overline{RAS}$ falls, $\overline{PD}$ also falls, turning off transistors 39 and 40, but the voltage D stays high for a time T4, during which the voltage C goes high, sharing the charge on all of the dummy capacitors 20 with the large predischarged capacitor 38. After C and D go low, Xwd and Xdum go high at T2 as before, and sensing occurs. As soon as sensing is complete, Xdum falls and D goes high so the dummy precharge can begin again. The precharge clock $\overline{PD}$ is already high at this point, so the common line 35 is charging and the large capacitor 38 is discharging. By beginning the dummy precharge early in the cycle the overall cycle time can be reduced.

While this invention has been described with reference to illustrative embodiments, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A semiconductor memory device comprising:
   an array of rows and columns of storage cells, each storage cell having a storage capacitor,
   at least one row of dummy cells adjacent said array of storage cells, each dummy cell having a capacitor, and an access transistor connecting the dummy capacitor to a column line,
   addressing means for activating one of said rows of storage cells and activating said row of dummy cells at a first time in an operating cycle,
   precharge means coupled to said dummy capacitor at a time prior to said first time in and operating cycle, and decoupled from said dummy capacitor at said first time and for a period thereafter, to thereby precharge said dummy capacitor to a reference voltage,
   and a charge-sharing circuit including a second capacitor coupled to said dummy capacitor for a time period just before said first time in an operating cycle to change the charge in the dummy capacitor.

2. A device according to claim 1 wherein said charge-sharing means discharges said second capacitor to ground and charges said dummy capacitor to a positive voltage, prior to said time period.

3. A device according to claim 1 wherein said storage cells are one-transistor dynamic memory cells.

4. A device according to claim 1 wherein said dummy capacitor and said storage capacitor are of the same size.

5. A dummy cell circuit for coupling to a bit line of a dynamic read/write memory array, comprising:
   a dummy capacitor,
   an access transistor having a source-to-drain path and a gate,
   means connecting the source-to-drain path of the access transistor between said bit line and said dummy capacitor,
   means connected to said gate of said access transistor to activate said transistor at a given point in an operating cycle,
   and charge-sharing means, including a second capacitor connected to said dummy capacitor,
   and means to discharge the dummy second capacitor to ground and charge the dummy capacitor to a selected voltage level at a time prior to said given point in an operating cycle.

6. A circuit according to claim 5 wherein said charge-sharing means includes a second transistor connecting said dummy capacitor to said second capacitor.

7. A circuit according to claim 6 wherein said means to precharge include third and fourth transistors each activated by precharge clock voltage means.

8. A circuit according to claim 5 wherein said memory array contains a plurality of one-transistor storage cells having storage capacitors of a given size.

9. A circuit according to claim 8 wherein said dummy capacitor and said second capacitor are each of about the same size as one of said storage capacitors.

10. A circuit according to claim 9 wherein said bit line is precharged to said voltage level at a time prior to said given point in an operating cycle.

11. A circuit according to claim 8 wherein said second capacitor is shared for a plurality of said dummy cells in said array.

* * * * *